United States Patent [19]
Richart et al.

[11] Patent Number: 5,774,395
[45] Date of Patent: Jun. 30, 1998

[54] ELECTRICALLY ERASABLE REFERENCE CELL FOR ACCURATELY DETERMINING THRESHOLD VOLTAGE OF A NON-VOLATILE MEMORY AT A PLURALITY OF THRESHOLD VOLTAGE LEVELS

[75] Inventors: Robert B. Richart; Shyam Garg, both of Austin, Tex.

[73] Assignee: Advanced Micro Devices, Inc., Sunnyvale, Calif.

[21] Appl. No.: 757,987

[22] Filed: Nov. 27, 1996

[51] Int. Cl.[6] .................................................. G11C 11/34
[52] U.S. Cl. ................................ 365/185.2; 365/185.03; 365/185.24; 365/210
[58] Field of Search .......................... 365/185.03, 185.09, 365/185.2, 210, 185.24, 185.01

[56] References Cited

PUBLICATIONS

M. Bauer, et al. "A Multilevel–Cell 32Mb Flash Memory", 1995 IEE International Solid State Circuits Conference, Feb. 16, 1995, pp. 132–133.

K. Yoshikawa, "Impact of Cell Threshold Voltage Distribution in the Array of Flash Memories on Scaled and Multi-level Flash Cell Design", 1996 Symposium on VLSI Technology Papers, IEEE, 1996, pp. 240–241.

*Primary Examiner*—David C. Nelms
*Assistant Examiner*—F. Niranjan
*Attorney, Agent, or Firm*—Skjerven, Morill, MacPherson, Franklin & Friel LLP; Ken J. Koestner

[57] ABSTRACT

A reference cell in a nonvolatile memory is electrically erasable and the electrically erasable character of the memory is exploited to expand the voltage range over which a differential amplifier is useful for sensing the state of a bit. Selected elements of a reference cell are electrically erased and reprogrammed for accurately tuning the sensing of multiple data states in a memory cell. For example, 64 or more data states may be tuned so that a single megabyte of memory is allocated to store six megabytes of information.

26 Claims, 13 Drawing Sheets

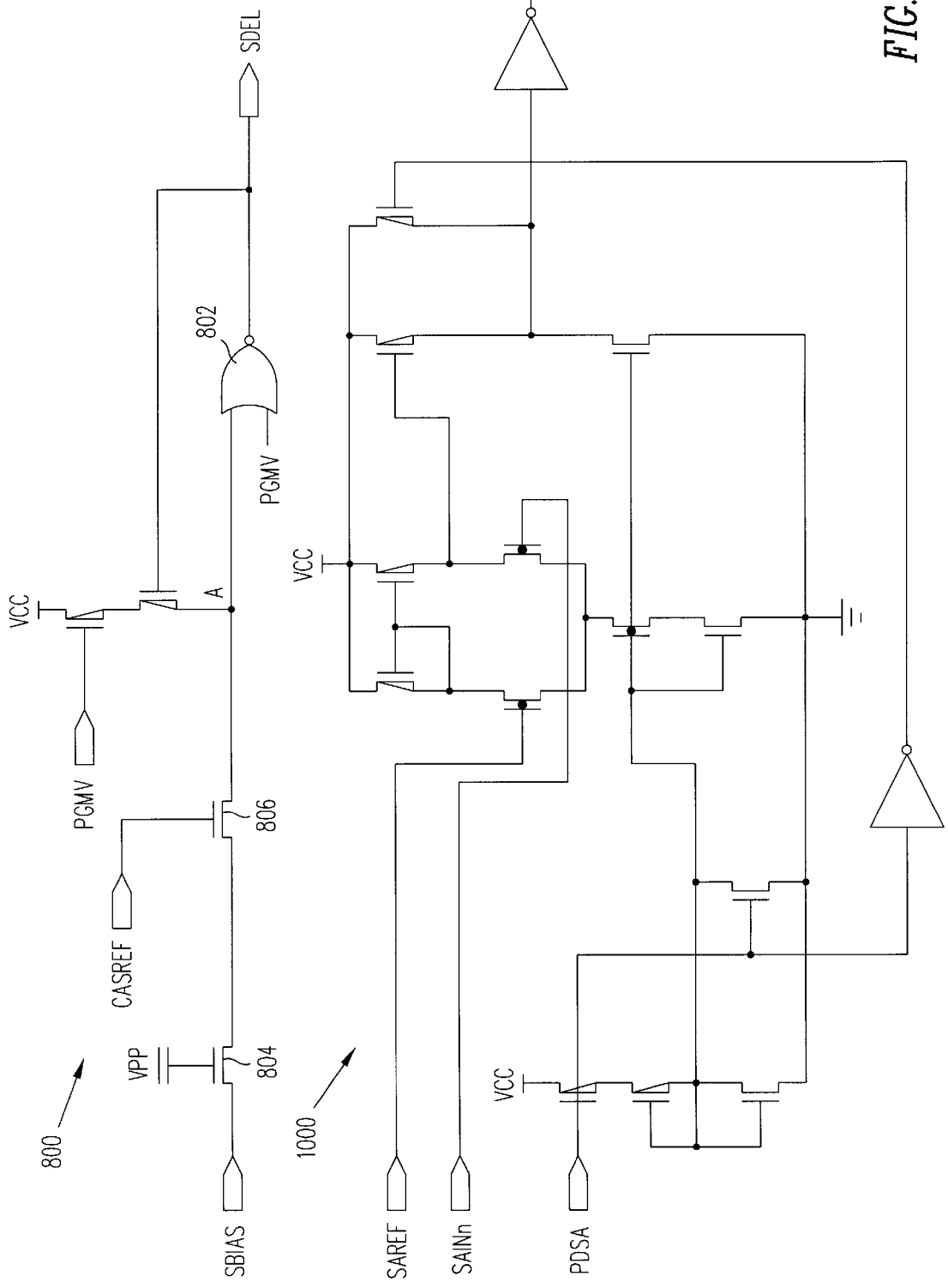

ELECTRICALLY ERASABLE REFERENCE CELL FOR ACCURATELY DETERMINING THRESHOLD VOLTAGE OF A NON-VOLATILE MEMORY AT A PLURALITY OF THRESHOLD VOLTAGE LEVELS

CROSS REFERENCE TO RELATED PATENT APPLICATION

This patent application is related to copending U.S. Patent Application entitled "Apparatus and Method for Multiple-level Storage in Non-volatile Memories" by Robert B. Richart and Shyam Garg Ser. No. 08/757,988, and having the same filing date as this application, the disclosure of which is incorporated herein by reference.

BACKGROUND OF THE INVENTION

1. Field of the Invention

The present invention relates to memory storage devices and systems. More particularly, the present invention relates to a circuit and operating method for accurately determining threshold voltage ($V_T$) of a nonvolatile memory bit at a plurality of $V_T$ levels, thereby supplying storage of multiple data bits in a single memory cell.

2. Description of the Related Art

Nonvolatile memories including electrically programmable read-only memories (EPROM), electrically-erasable programmable read only memories (EEPROM), and FLASH memories store information by setting individual cells within a memory array to selected threshold voltages ($V_T$). Typically, two threshold voltages are defined so that data is set to a binary value of "0" or "1". Data integrity is established through monitoring of the threshold voltage of the individual cells since data loss occurs in the case of shifts in $V_T$.

Typically a bit in nonvolatile memory is accessed or monitored using one of two techniques for monitoring the threshold voltage($V_T$) of a storage cell. In a first technique, a storage cell is directly accessed, measurements of drain-to-source current ($I_{DS}$) and gate voltage ($V_G$) are performed, and threshold voltage ($V_T$) is calculated. The direct measurement technique has several drawbacks. First, accuracy of the $V_T$ measurement is poor due to a lack of amplification of the current ($I_{DS}$) and voltage ($V_G$) signals. Second, the $V_T$ measurement accuracy is degraded due to disturbance of the $V_T$ signal during the long access times which are necessary for measuring the current ($I_{DS}$).

In a second technique, a storage cell is accessed using an on-chip differential amplifier. Several advantages are gained using a differential amplifier measurement. First, amplification magnifies the voltage scale so that fine distinctions in the $V_T$ signal are resolved. Second, the differential amplifier technique is performed with a fast-access measurement, typically 45 ns or faster, so that the measurement does not disturb the $V_T$ signal of the measured bit.

One advantage of the monitoring technique using a differential amplifier is that such a technique allows a single memory cell of nonvolatile memory to designate multiple levels of data, thereby increasing the amount of storage possible in a single cell. M. Bauer et al. in "A Multilevel-Cell 32Mb Flash Memory", 1995 IEEE International Solid-State Circuits Conference, P. 132, discloses a circuit and technique for multilevel cell storage to double memory density storage.

What is needed is a circuit and operating method that makes further advances in memory density storage possible.

SUMMARY OF THE INVENTION

In accordance with the present invention, a reference cell in a nonvolatile memory is electrically erasable and the electrically erasable character of the memory is exploited to expand the voltage range over which a differential amplifier is useful for sensing the state of a bit.

In accordance with an aspect of the present invention, selected elements of a reference cell are electrically erased and reprogrammed for accurately tuning the sensing of multiple data states in a memory cell. For example, 64 or more data states may be tuned so that a single megabyte of memory is allocated to store six megabytes of information. Reliable storage for a large number of data ranges, such as 64 data ranges, is achieved only by avoiding overlap between data ranges. Overlapping of data ranges often causes false readings. This overlapping between data ranges is avoided by precisely positioning the reference cell $V_T$. An electrically-erasable reference cell is used to allow modification of threshold voltage $V_T$ without affecting the threshold voltage $V_T$ of other reference cells in the memory. In contrast, reference cells that are erased using an ultraviolet erase operation cannot be selectively erased cell-by-cell.

In accordance with the present invention, a storage cell in a nonvolatile memory is accessed by comparing the threshold voltage ($V_T$) of the storage cell to the threshold voltage of a reference cell using a differential amplifier. The $V_T$ of the reference cell is programmed and programmable and, furthermore, electrically erasable. The electrically erasable characteristic of the reference cell is exploited to precisely program the $V_T$ of the reference cell over a full $V_T$ range, for example from -5V to 15V. Precise programming of the $V_T$ of the reference cell allows a single memory cell to store multiple bits of information.

In accordance with a first embodiment of the present invention, a circuit includes an interface circuit for interfacing to a nonvolatile memory including an individual memory cell and a programmable and electrically erasable reference cell circuit which defines a plurality of data states in the individual memory cell. A first plurality of conductive lines connect the interface circuit to the reference cell circuit and a second plurality of conductive lines is included for connecting the interface circuit to an erase voltage source. A plurality of switches are connected to alternatively (a) block the first plurality of conductive lines while the second plurality of conductive lines are conductive or (b) connecting the first plurality of conductive lines while the second plurality of conductive lines are blocked.

In accordance with a second embodiment of the present invention, a method of operating a nonvolatile memory includes the step of programming a plurality of threshold voltages in a reference storage. The threshold voltages define a plurality of data states of an individual memory cell of the nonvolatile memory. The method further includes the steps of electrically erasing selected ones of the programmed plurality of threshold voltages in the reference storage and fine-tune programming the selected ones of the programmed plurality of threshold voltages in the reference storage.

A further embodiment of the method includes the additional steps of sensing a voltage from an individual memory cell of the nonvolatile memory, sensing a plurality of programmed threshold voltages from the reference storage and comparing the sensed voltage from the individual memory cell to the sensed plurality of programmed threshold voltages from the reference storage to determining a multiple-bit data value based on the comparison.

Many advantages are achieved by the described circuit and operating method. One advantage is that the range and accuracy of threshold voltage monitoring is improved. Another advantage is that precise setting of reference cell current is achieved without performing an ultraviolet memory erase operation. The described circuit and operating method also supports repair of bits within a memory that lose charge. Other advantages are an increase in the capacity of storage, a reduction in the memory per-bit cost, and a decrease in circuit size for a given memory capacity.

A capability to erase and reprogram a reference cell is highly advantageous to compensate for programming overshoot in a memory with multiple reference cells. The capability to electrically erase individual reference cells increases the probability of achieving a specified threshold voltage $V_T$ target from approximately 95% to nearly 100%. Without this improvement, a memory having as few as sixteen reference cells with a 95% success rate per cell achieves only a $(0.95)^{16}=0.44$ (44%) success rate per chip. In comparison, a sixteen-reference cell chip using electrically-erasable reference cells attains nearly a 100% success rate per chip.

The circuit and method are advantageous for improving the resolution of threshold voltage $V_T$ in a storage cell while sensing within the range of voltages that are normally applied to an integrated circuit. Also, the circuit and method are highly advantageous for programming multiple-level storage cells with a large number of levels, such as 64 or 256 levels.

Accordingly, the usage of electrically erasable reference cells is highly advantageous for improving the yield in manufacturing of memories and for allowing the storage interface usage in combination with memories of different types, models and manufacturers.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIG. 8 is a schematic block diagram showing a reference array gate voltage delay circuit.

FIG. 10 is a schematic block diagram which illustrates a differential amplifier for usage in the storage interface shown in FIG. 2.

DETAILED DESCRIPTION OF THE PREFERRED EMBODIMENTS

Figure 1:
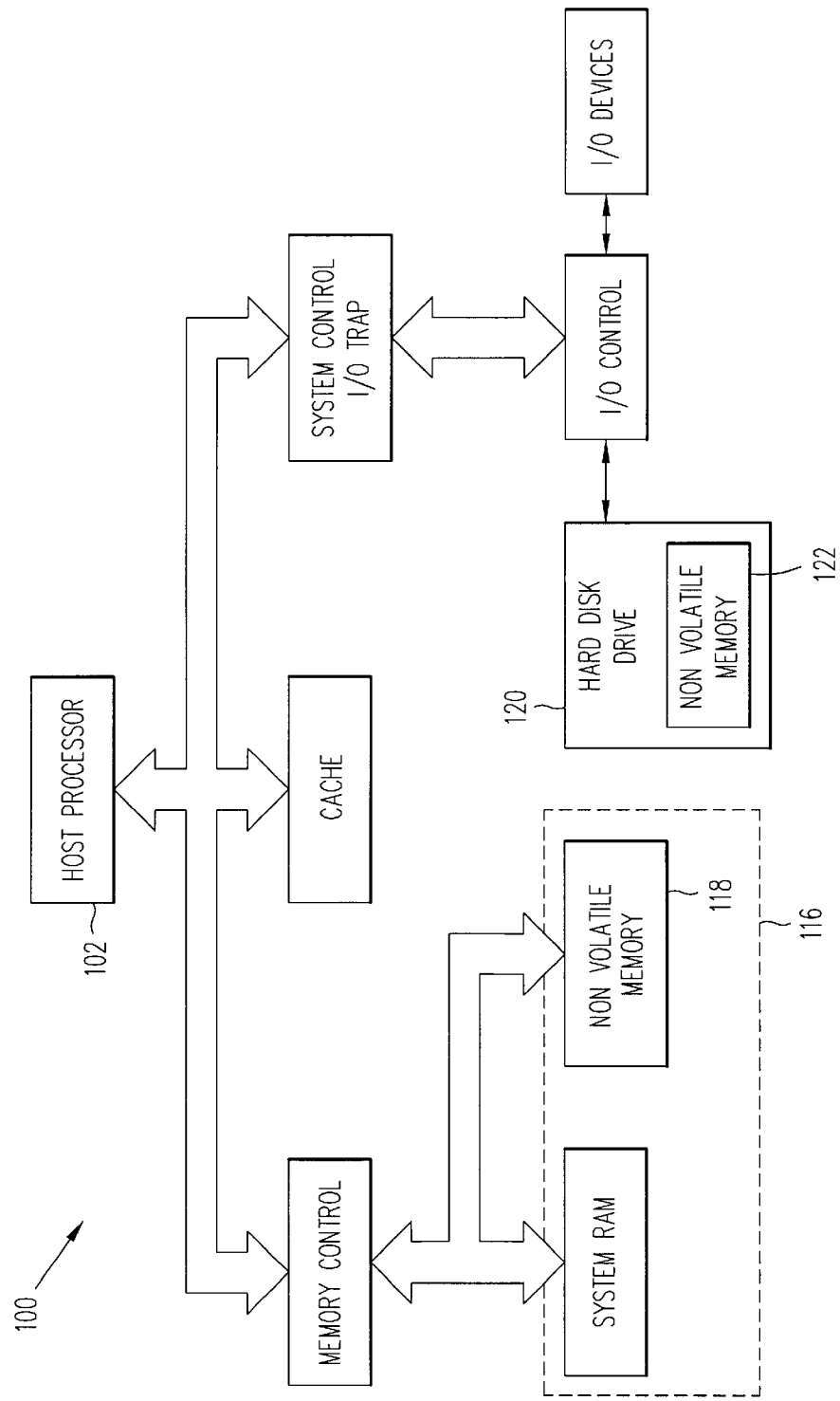
FIG. 1 is a high-level schematic block diagram illustrating a computer system in accordance with an embodiment of the present invention.

Referring to FIG. 1 a high-level schematic block diagram illustrates a computer system 100 including a host processor 102 such as an x86 processor. The host processor 102 executes programs based on instructions and data held in a system memory 116 including a nonvolatile memory 118. In other embodiments, the host processor 102 is connected to a hard drive storage 120 which may be composed of nonvolatile memories 122.

Figure 2:
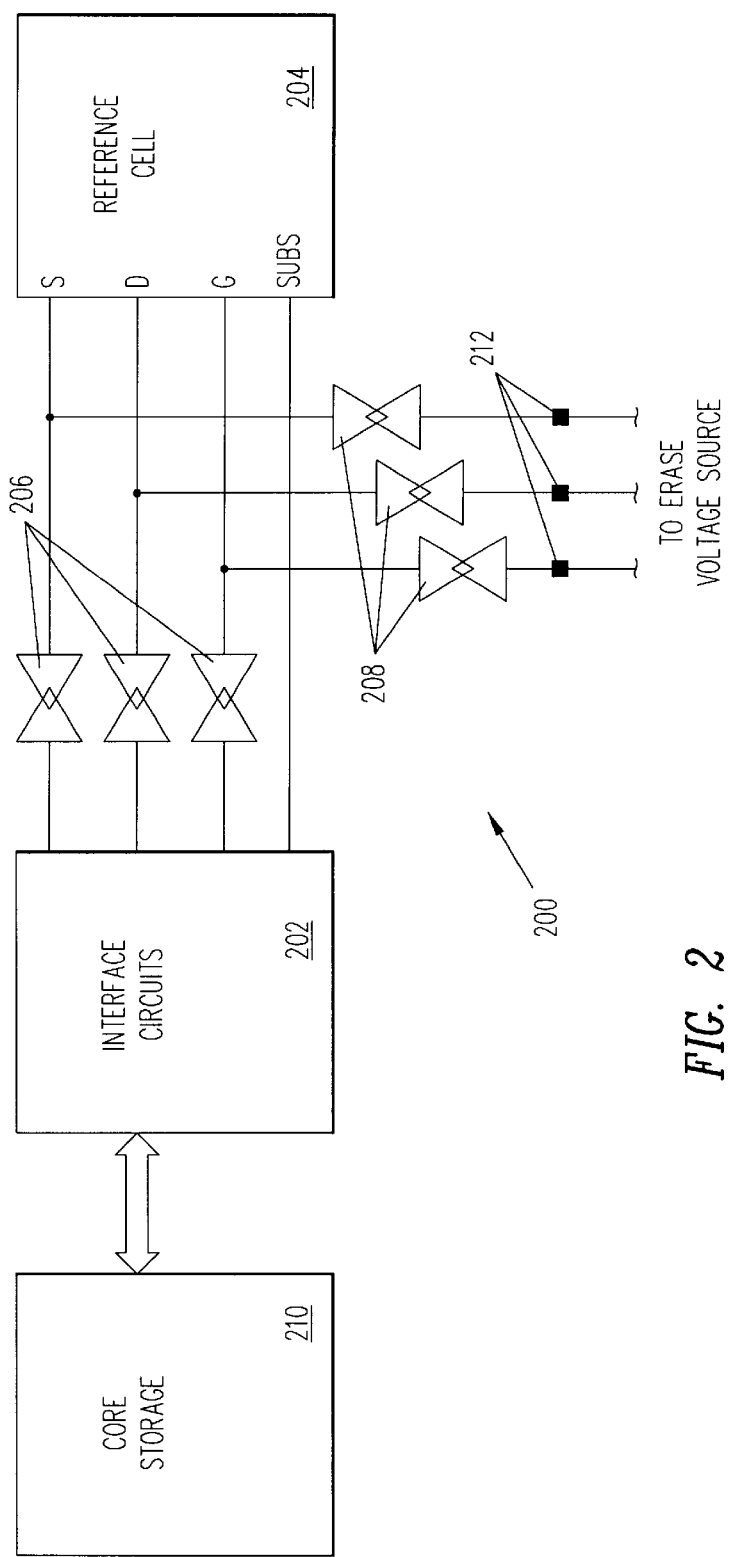
FIG. 2 is a schematic block diagram which illustrates a storage interface for storing multiple data bits in single storage cells of a memory using electrically-erasable reference cells.

Referring to FIG. 2, a schematic block diagram illustrates a storage interface 200 for storing multiple data bits in single storage cells of a memory. The storage interface 200 includes an interface circuits block 202, a reference cell block 204, a plurality of reference connecting switches 206, and a plurality of erase voltage switches 208. The interface circuits block 202 supplies connections to a core storage 210, which is external to the storage interface 200, and performs functions including decoding of addresses, forming appropriate switch connections for accessing memory, sensing of voltage levels of data in the core storage 210, and generation of timing signals for timing interactions between the core storage 210 and the interface circuits block 202. The reference cell block 204 includes a plurality of reference cell transistors (not shown) which set reference voltage levels for comparing to data in the core storage 210. The reference cell block 204 is connected to the storage interface 200 by lines connected to the transistors. In one embodiment, the transistors are MOS transistors and the reference cell block 204 is connected to the interface circuits block 202 by lines connected to the source, drain, gate and substrate terminals of the transistors. Accordingly, each reference cell in the reference cell block 204 serves as a nonvolatile bit allowing access to source, drain, gate, and substrate terminals of a transistor.

The core storage 210 is a nonvolatile storage such as EPROM, EEPROM or FLASH memory which is typically used as a media for mass storage. The storage interface 200 includes structures and functionality which improves the bit density of bit storage in the core storage 210, increasing the amount of bit storage per storage cell beyond the conventional one-bit per cell capacity. The core storage 210 includes multiple-level storage cells that advantageously increase the capacity of storage, reduces the memory per-bit cost, and reduces the circuit size for a given memory capacity.

Figure 3:
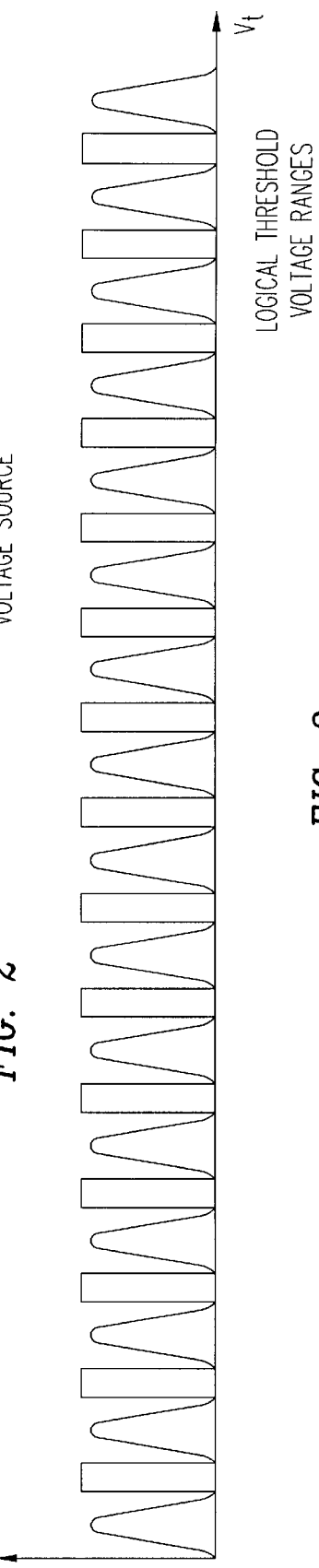
FIG. 3 is a graph which depicts an exemplary distribution of storage cell threshold voltage ranges for discrimination by the storage interface shown in FIG. 2.

In multiple-level operation, a cell includes four bits of storage for a 16-level cell and eight bits of storage for a 256-level cell. Referring to FIG. 3, a graph depicts an exemplary distribution of storage cell threshold voltage ranges which are discriminated by the storage interface 200 and core storage 210. Threshold voltages of reference cells within the reference cell block 204 are positioned in separation regions between each of a plurality of single-level distributions during an initialization-program definition operation in which threshold voltages of reference cells within the reference cell block 204 are determined. In some embodiments, the threshold voltages are positioned at a lower threshold voltage (Vt) edge of the storage cell threshold voltage ranges.

During a memory program operation, the threshold reference cells are used to set the minimum voltage to program a cell. Programming of the memory cells of the core storage 210 is typically performed by applying a series of programming pulses to the memory cells of the core storage 210 to adjust the threshold voltage to a selected level. In the illustrative embodiment, during a memory read operation, a parallel data read operation is performed to distinguish a voltage between the multiple threshold ranges.

The interface circuits block 202 includes a plurality of differential amplifiers for sensing and comparing the reference and bit-line signals from a reference cell of the reference cell block 204 and from a bit-line of the core storage 210, respectively.

The reference connecting switches 206 and erase voltage switches 208 are implemented in one embodiment as transmission gates which either block a signal or allow a signal to pass. The reference connecting switches 206 selectively connect and disconnect the source, drain and gate lines of the interface circuits block 202 from the reference cell block 204. The erase voltage switches 208 selectively connect and disconnect the source, drain and gate lines of the reference cell block 204 from bonding pads 212 for connection to erase voltage sources. The reference connecting switches 206 and the erase voltage switches 208 are controlled to implement a reference erase mode of operation in which, when the reference erase mode signal is high, the storage interface 200 operates in a standard operating mode and the interface circuits block 202 is functionally connected to the reference cell block 204. When the reference erase signal is low, erase voltages are applied to the reference cell block 204 so that both positive and negative gate voltages are selectively supplied to erase the reference cells one cell at a time.

The reference connecting switches 206 and erase voltage switches 208 are controlled to precisely position the reference cells of the reference cell block 204. The reference cells are programmed to precise voltages to define voltage windows. The voltage windows of the reference cells are mutually adjusted to separate, nonoverlapping voltage ranges for a plurality of voltage ranges. For a storage interface 200 that supports storage of four bits per cell, sixteen separate, nonoverlapping voltage ranges are defined. For a storage interface 200 that supports storage of eight bits per cell, 256 separate, nonoverlapping voltage ranges are defined.

The programming of threshold voltages in the reference cell block 204 is highly predisposed to error. To define such a large number of ranges, the reference cells are programmed to a highly precise tolerance level so that the windows do not overlap. Precise programming is difficult since overshoot of the threshold voltage is common for each programmed reference cell. A suitable highly precise programming of the reference windows and, since each window of each circuit die is programmed, a suitable production yield is very difficult to achieve. The reference connecting switches 206 and erase voltage switches 208 are highly advantageous for allowing misprogrammed windows to be erased and correctly programmed to obtain nonoverlapping windows. A capability to erase and reprogram a reference cell is highly advantageous to compensate for programming overshoot. Usage of an electrically erasable reference cells allows reprogramming of each reference cell in the reference cell block 204 individually so that overshoot of the voltage of a single cell is corrected.

Figure 4:
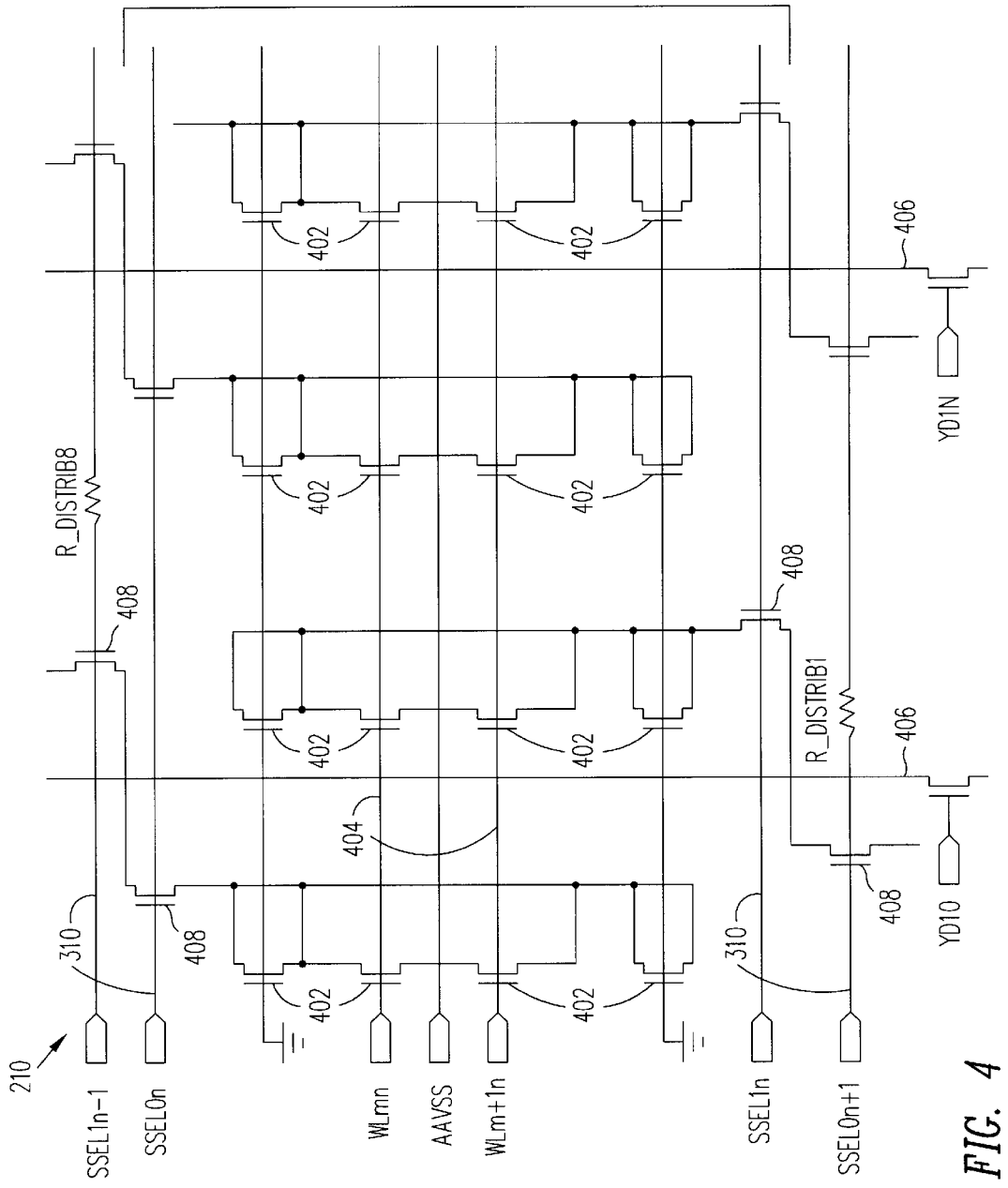
FIG. 4 is a schematic circuit diagram showing a portion of an array of storage cells in the core storage.

FIG. 4 is a schematic circuit diagram showing a portion of an array of storage cells in the core storage 210. The core storage 210 includes a plurality of storage nonvolatile MOSFET transistors 402 which are arranged in columns with each column including a plurality of transistors connected in parallel to a bit line. A plurality of word lines 404 are connected to gate terminals of the transistors 402 so that a word line of the plurality word lines 404 connects to the gate terminals of transistors. Source and drain terminals of the storage MOSFET transistors 402 in a column are connected to form a bit-line of a plurality of bit-lines 406. The bit-lines 406 include an enable transistor 408 having a gate terminal connected to a sector select line 410. The sector select lines 410 include a polysilicon resistance R to more suitably match the RC time constant of a sector select line 410 to the RC time constant of the word lines 404.

Figure 5:
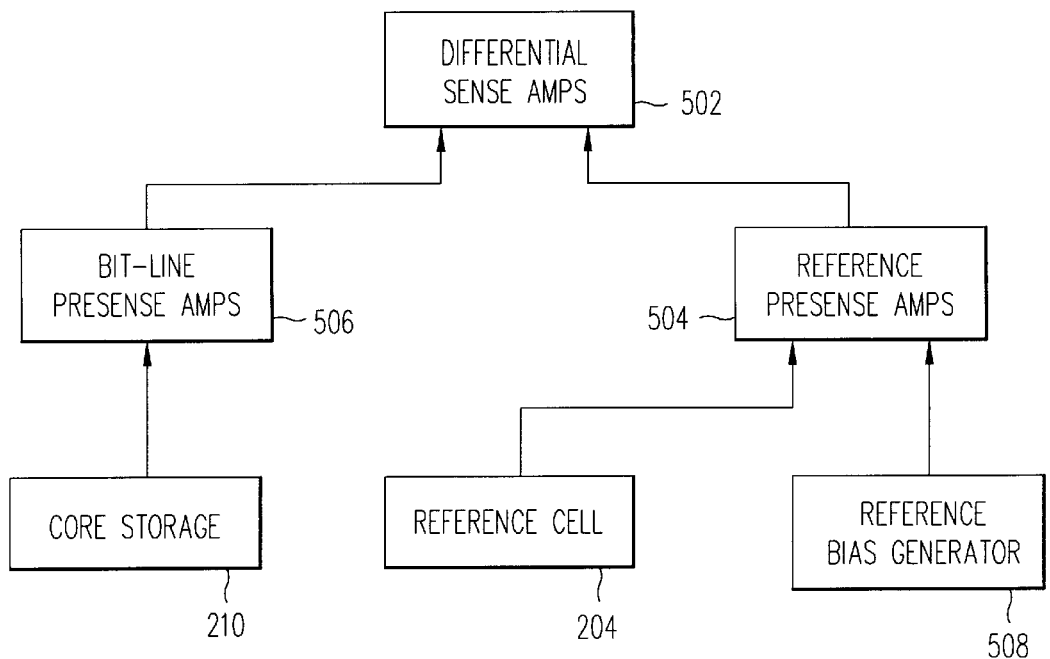
FIG. 5 is a schematic block diagram illustrating an embodiment of an interface circuit in the storage interface shown in FIG. 2.

Referring to FIG. 5, a schematic block diagram illustrates an embodiment of the interface circuits block 202. The interface circuits block 202 includes a plurality of differential sense amplifiers 502, a reference presense amplifier 504, an array of bit-line presense amplifiers 506, a reference bias generator 508. The individual differential sense amplifiers of the differential sense amplifiers 502 have a first input terminal connected to an output terminal of individual bit-line presence amplifiers of the array of bit-line presense amplifiers 506 and a second input terminal connected to an output terminal of a reference presense amplifier of the reference presense amplifier 504. Accordingly, the plurality of differential amplifiers 502 which are connected in series to sense a single reference cell of the reference cell block 204. The number of differential amplifiers is set according to the number of voltage levels to be stored within a single storage cells of a memory. For example, a four-level cell may use one or four differential amplifiers, a sixteen-level cell may use four or sixteen differential amplifiers, and a 256-level cell uses 64 or 256 differential amplifiers.

The differential sense amplifiers 502 are standard differential amplifiers which receive reference and bit-line signals from a reference cell of the reference cell block 204 and from a bit-line of the core storage 210, respectively. In one embodiment, the differential sense amplifiers 502 have a DC gain of 50 dB. A power-down signal line is connected to the differential sense amplifiers 502 to disable an amplifier to conserve DC current in power-down mode.

In one illustrative embodiment, the interface circuits block 202 includes a differential amplifier to distinguish each level of threshold voltage ($V_T$). In particular, an interface circuits block 202 for a 16-level, 4-bit storage interface 200 includes sixteen differential amplifiers and sets of associated bias circuits. An interface circuits block 202 for a 256-level, 8-bit storage interface 200 includes 256 individual differential amplifiers and sets of associated bias circuits.

In an alternative embodiment, an interface circuits block 202 includes a differential amplifier to distinguish each bit of the stored data using a binary search. An interface circuits block 202 which uses the binary search for a 16-level, 4-bit storage interface 200 includes four differential amplifiers and sets of associated bias circuits, and sixteen binary weighted reference cells. An interface circuits block 202 which uses the binary search for a 256-level, 8-bit storage interface 200 includes eight differential amplifiers and sets of associated bias circuits, and 256 binary weighted reference cells. Using the binary search technique, the threshold voltage ($V_T$) is first compared to a half-range reference cell voltages in a first step. In a second step, the threshold voltage ($V_T$) is compared to ¾ and ¼ range reference cell voltages in a second step, performing a binary search in subsequent steps. The binary search technique uses a smaller circuit area than the test of each level, but employs a longer test duration.

Figure 6A:
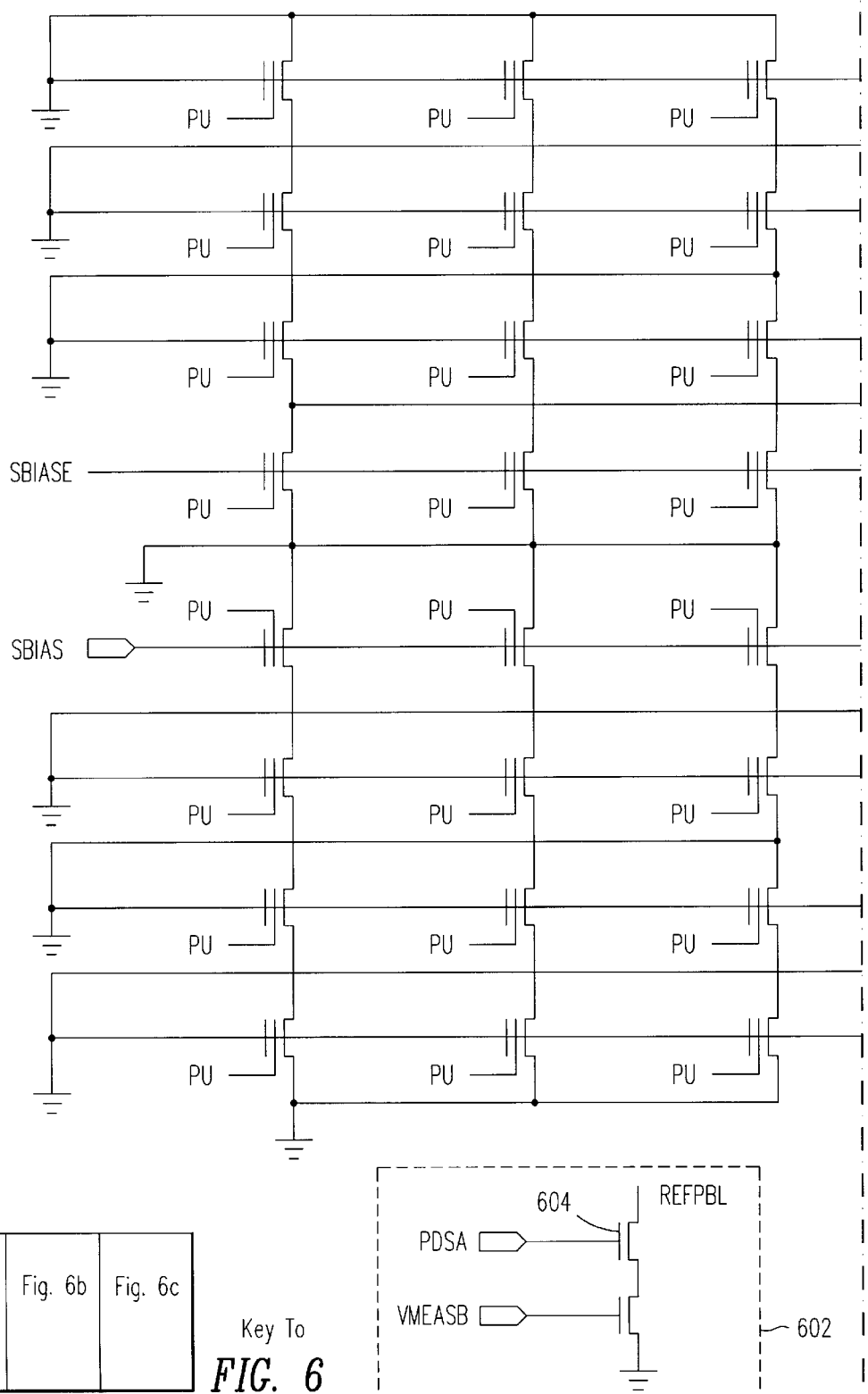
FIG. 6 is a schematic block diagram illustrating a portion of a reference array storage for usage with the storage interface shown in FIG. 2.
Figure 6B:
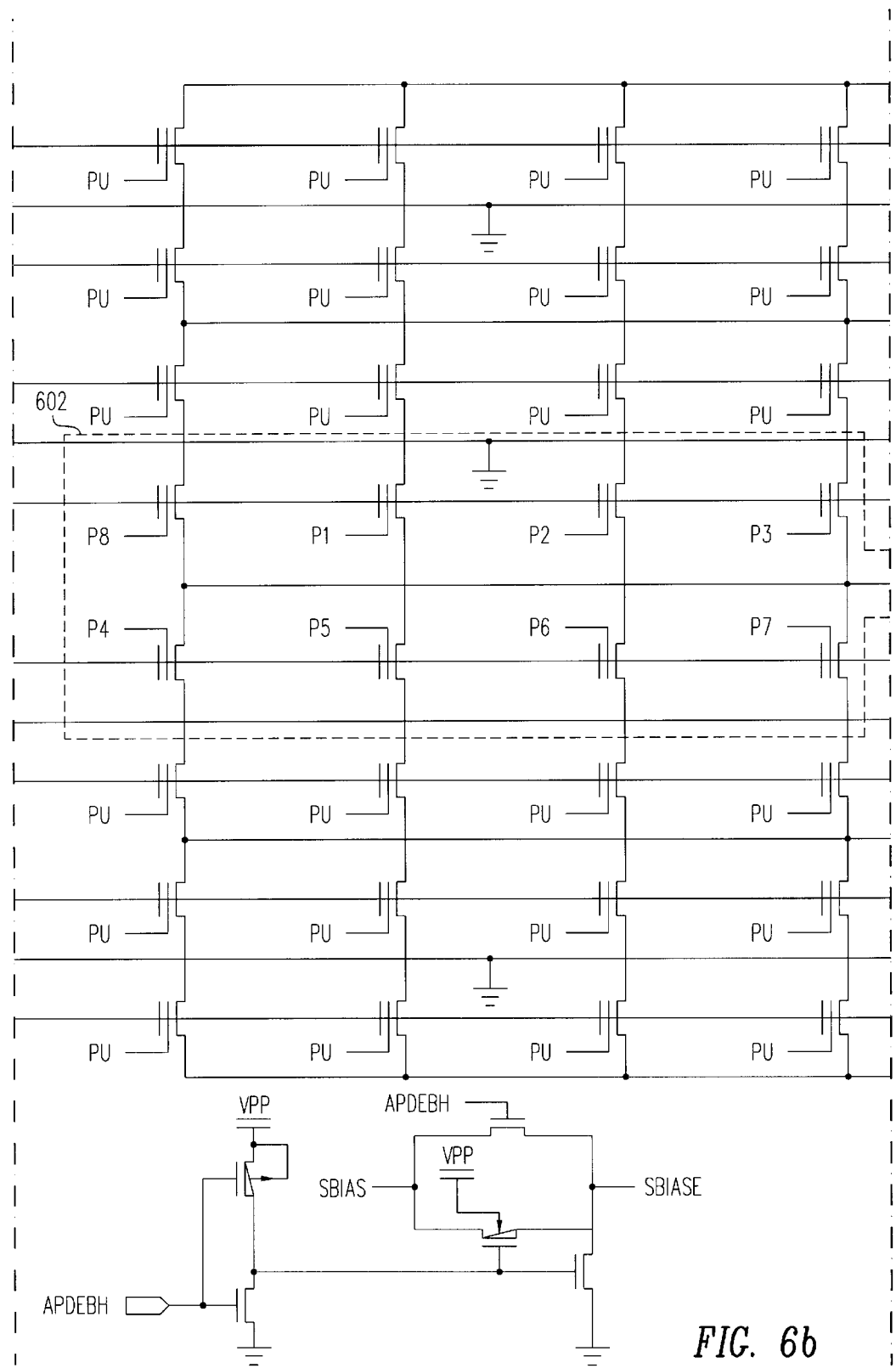
Figure 6C:
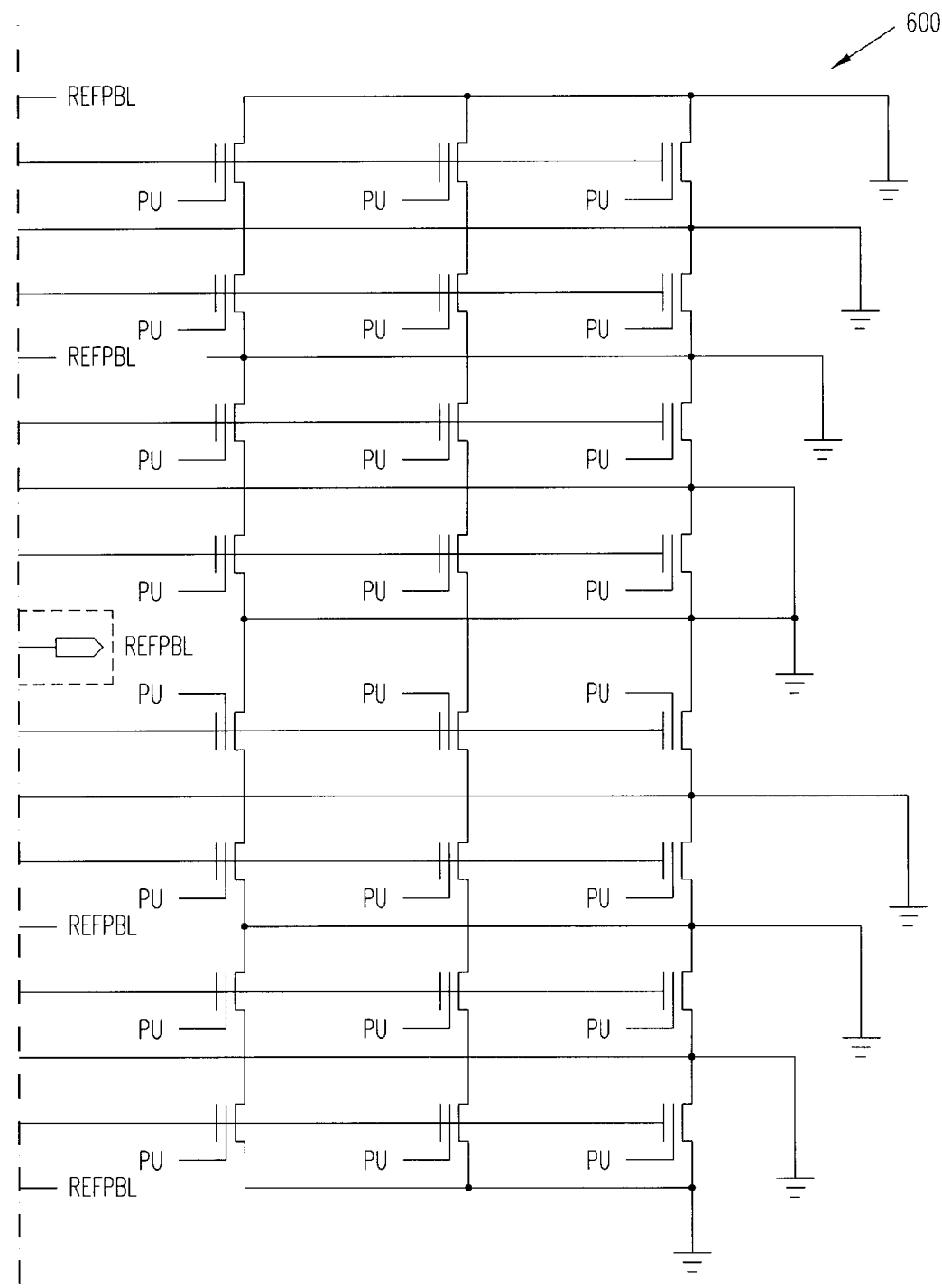

Referring to FIG. 6, a schematic block diagram illustrates a portion of a reference cell array 600 for a reference presense amplifier 504. The reference cell array 600 includes a plurality of MOSFET transistors arranged in an array of rows and columns. The reference cell array 600 is arranged in a plurality of active cells 602, one cell for each of the presense amplifiers. A bias voltage level signal is applied to the gates of the transistors in the active 602 and the active cell 602 generates a reference array gate voltage. The active cell 602 has an output terminal connected to a pull-down transistor 604. The pulldown transistor 604 has a gate terminal that is connected to receive a power-down select signal to ensure that the reference bit-line voltage consistently is initialized to a known value.

Figure 7:
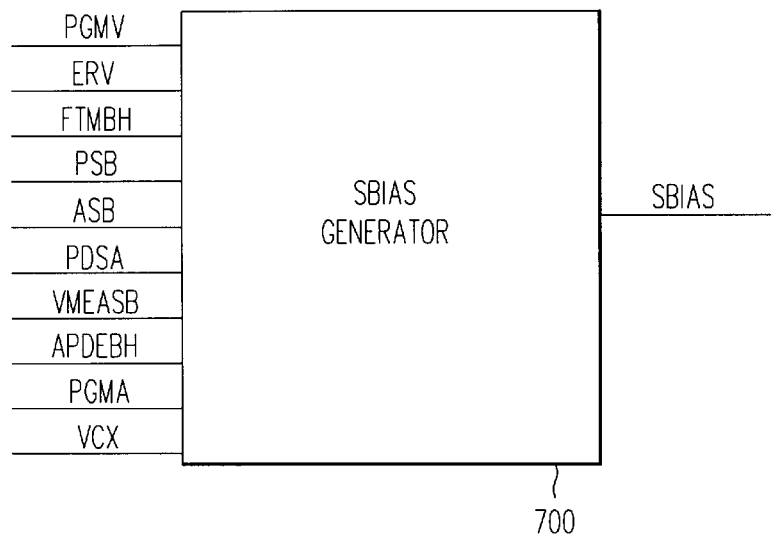
FIG. 7 is a schematic block diagram showing a bias circuit for supplying a reference array gate voltage.

The reference array gate voltage is supplied by a bias circuit 700, which is depicted in a schematic block diagram illustrated by FIG. 7. The bias circuit 700 generates a bias voltage signal for application to the gates of transistors in the reference cell array 600. The bias circuit 700 receives a program voltage control signals including an erase (ER) command, an erase and verify (ERV) command, a program verify (PGMV) command, a program read (PGMR) command, and a floor test mode (FTMBH) command. The bias circuit 700 is also The bias circuit 700 sets a voltage level of a bias voltage according to the applied command. The bias circuit 700 include a plurality of selectively sized transistors, including pullup and pulldown transistors, which are set active and inactive according to the selection of the program voltage control signals to generate a selected bias voltage. During an erase verify operation (ERV) of the storage interface 200, the bias voltage signal is set to VCC. For a read operation (PGMR), the bias voltage signal is set to a first defined fraction of VCC. During a program verify (PGMV) operation, the bias voltage signal is set to a second defined fraction of VCC. The different biases are applied to a reference cell of the reference cell array 600 to select a particular differential sensing mode. The selection of a differential sensing mode determines the threshold voltage $V_T$ of the reference cell.

Referring to FIG. 8, a reference array gate voltage delay circuit 800 is inserted between the bias circuit 700 and the reference presense amplifiers 504 to delay the onset of activation of the reference presense amplifiers 504 until the reference presense amplifier array 700 is active. Insertion of the reference array gate voltage delay circuit 800 eliminates an output glitch during application of power to the storage interface 200. The reference array gate voltage delay circuit 800 is implemented by skewing the trip point of a NOR gate 802. P-channel pullup transistors 804 and 806 reduce the delay duration suitable for supplying charge to rapidly raise the bias voltage signal.

Figure 9:
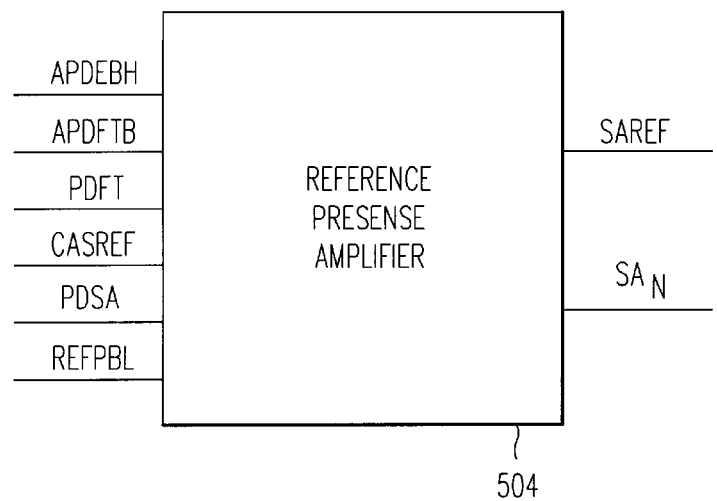
FIG. 9 is a schematic circuit diagram showing an amplifier of the reference presense amplifiers of the interface circuits shown in FIG. 5.

Referring to FIG. 9, a schematic circuit diagram shows an amplifier of the reference presense amplifiers 504. In the illustrative embodiment, the reference presense amplifier 504 is a cascode preamplifier which includes a pullup transistor (not shown), a pulldown transistor (not shown), and a plurality of presense load transistors (not shown). Transistors are sized to increase feedback speed, reduce overshoot, and reduce voltage swing on the output signal, thereby decreasing access time.

Referring to FIG. 10, a schematic block diagram illustrates a differential amplifier 1000 which is suitable for usage in the storage interface 200. The differential amplifier 1000 receives a first input signal from an amplifier of the reference presense amplifiers 504 and a second input signal from an amplifiers of the array of bit-line presense amplifiers 506 and generates a signal indicative of the difference between the input signals. The differential amplifier 1000 also receives a power-down signal to disable the amplifier during a power down mode of operation. Generally, an storage interface 200 includes a plurality of differential amplifiers 1000 for comparing the multiple levels of a storage cell in the core storage 210.

Figure 11:
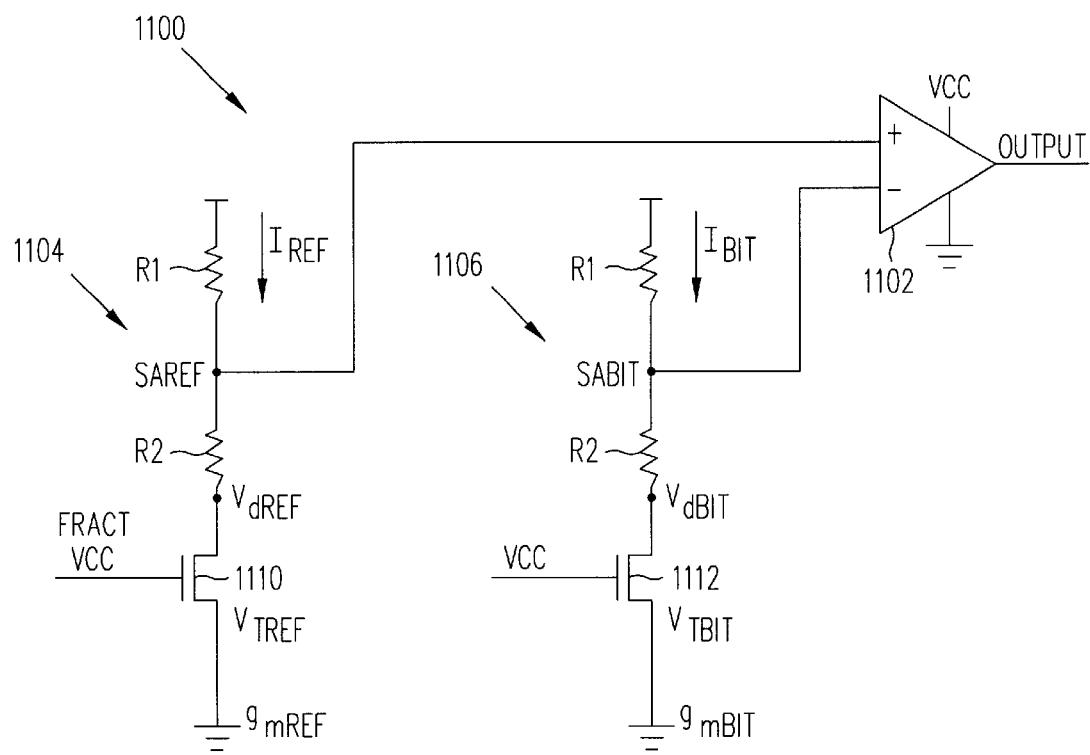
FIG. 11 is a schematic circuit diagram showing a simplified circuit model of the reference presense amplifier and a bit-line presense amplifier to facilitate understanding of an embodiment of the operating method of the present invention.

Referring to FIG. 11, a schematic circuit diagram shows a simplified circuit model of a differential amplifier 1102, a reference presense amplifier 1104, and a bit-line presense amplifier 1106 to facilitate understanding of an embodiment of the operating method of the present invention. A simplified circuit in the reference presense amplifier 1104 includes a first resistor R1 connected between a power supply VCC and a reference node SAREF, a second resistor R2 connected in series with the first resistor R1 at the reference node SAREF, and a transistor 1110 having a drain terminal connected to the second resistor R2, a source connected to ground, and a gate connected to receive a bias voltage. A current $I_{REF}$ conducts through the first resistor R1. The drain voltage of the transistor 1110 is $V_{dREF}$. The gate voltage of the transistor 1110 is a defined fraction of VCC. The threshold voltage of the transistor 1110 is the reference threshold voltage $V_{TREF}$. The transconductance of the transistor 1110 is $g_{mREF}$.

A simplified circuit in the bit-line presense amplifier 1106 includes a first resistor R1 connected between a power supply VCC and a bit-line node SABIT, a second resistor R2 connected in series with the first resistor R1 at the bit-line node SABIT, and a transistor 1112 having a drain terminal connected to the second resistor R2, a source connected to ground, and a gate connected to receive a bias voltage. A current $I_{BIT}$ conducts through the first resistor R1. The drain voltage of the transistor 1112 is $V_{dBIT}$. The gate voltage of the transistor 1112 is VCC. The threshold voltage of the transistor 1112 is the bit-line threshold voltage $V_{TBIT}$. The transconductance of the transistor 1112 is $g_{mBIT}$.

Typically the threshold voltage $V_T$ of a transistor is distributed between 2.5 volts and 5 or 6 volts. The threshold voltage $V_T$ is separated into a plurality of threshold voltage windows $\lambda V_T$, for example 16 or 256 windows. Achieving a suitable threshold voltage $V_T$ resolution or noise margin is difficult. The differential amplifier 1102 facilitates the resolution of threshold voltage windows $\lambda V_T$ by effectively expanding the voltage scale, typically by 10 or 12 times so that a 0.5 volt spread becomes an effective spread of about 6 volts. The differential amplifier 1102 thus improves the voltage resolution of a storage cell and improves signal to noise performance.

The differential amplifier 1102 determines the difference between the current in the reference cell $I_{REF}$ and the current in a cell of the core storage 210 $I_{BIT}$ by comparing the voltage at node SAREF to the voltage at node SABIT. Accordingly, the result of the access of a memory cell is determined by the threshold voltage $V_{TBIT}$ and transconductance $g_{mBIT}$ of the core storage element. If the current $I_{TBIT}$ is less than the current $I_{REF}$, then the output signal is low on the differential amplifier 1102. However, when the current $I_{BIT}$ is above the current $I_{REF}$, then the output signal of the differential amplifier 1102 is high.

Figure 12:
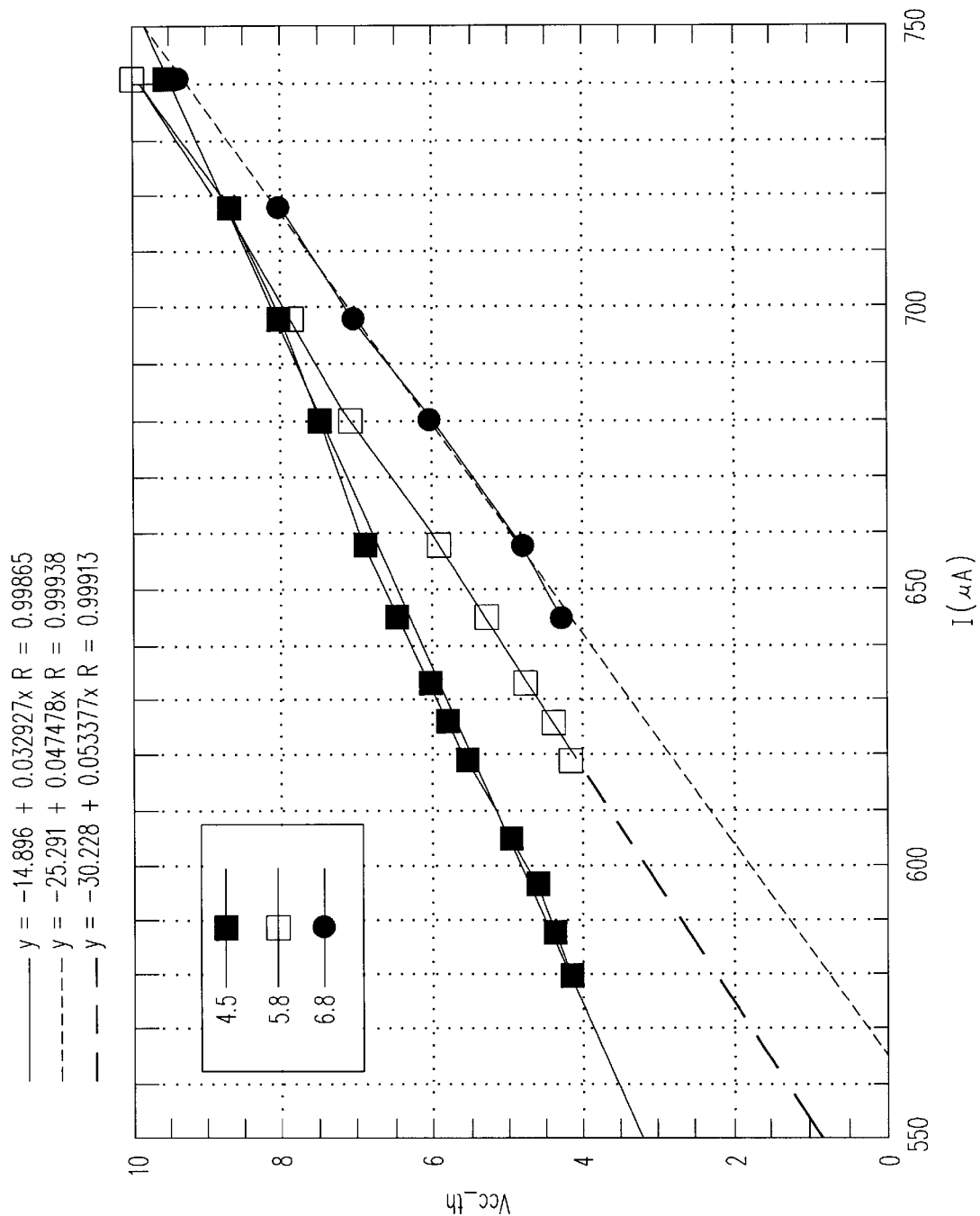
FIG. 12 is a graph illustrating a relationship between on-chip logical threshold voltage $V_T$ levels of three bits A, B and C with respect to the reference cell as the reference cell is programmed to lower $I_{DS}$ values.

Referring to FIG. 12, a graph illustrates a technique for programming a reference cell of the reference cell array 600. The VCC threshold voltage varies based on the programming of the reference cell. As a reference cell is programmed, the reference cell current $I_{REF}$ is decreased for a particular bit in a selected state and the VCC threshold of the bit drops within the magnified window as detected by the differential amplifier 1102. As the cell current $I_{BIT}$ of the storage cell rises above or falls below the window defined by the cell current $I_{REF}$ of the reference cell, the bit is no longer sensed.

Figure 13A:
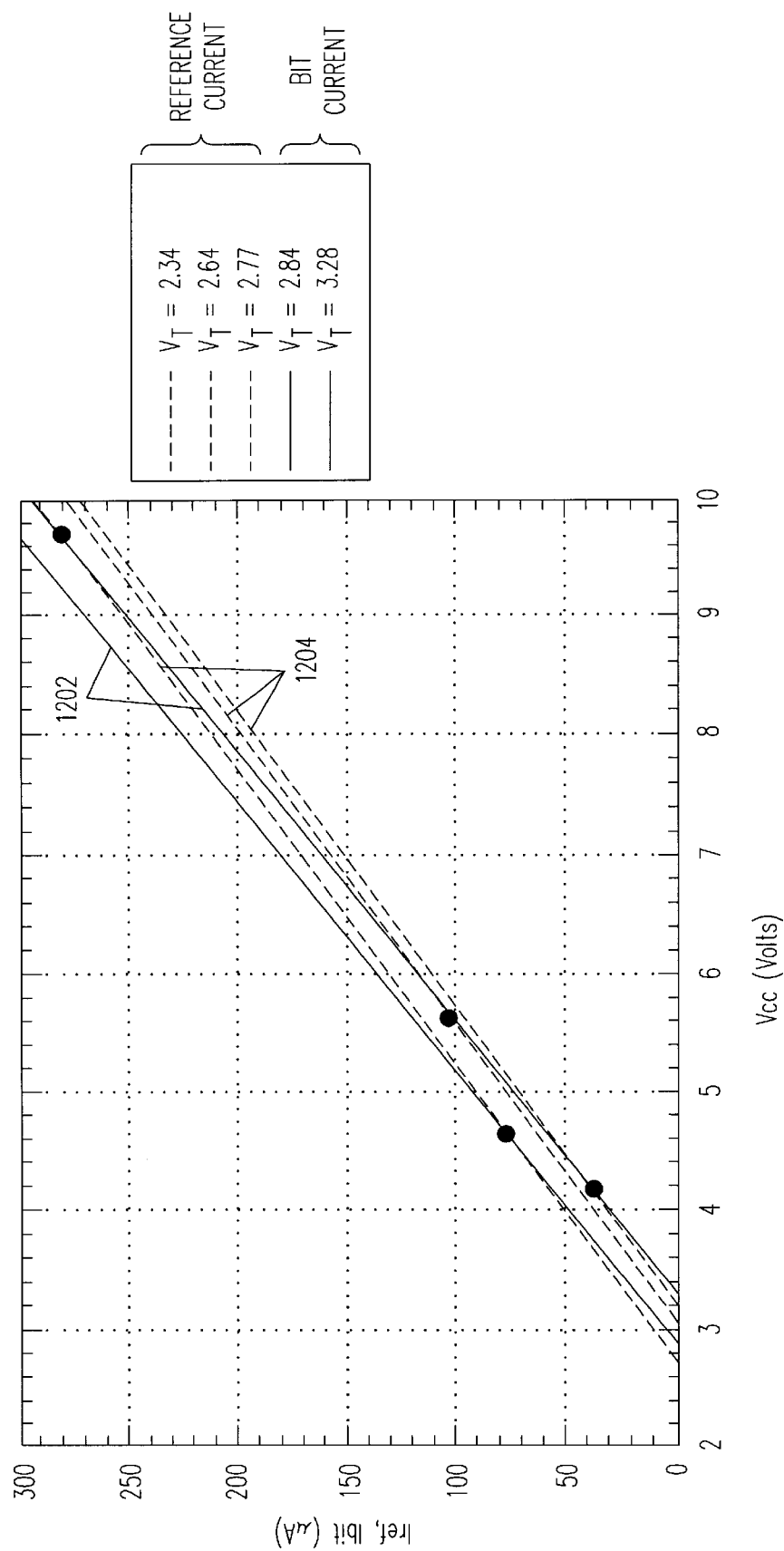
FIG. 13A and 13B are graphs which depict the operation of a sensing technique for sensing the threshold voltage $V_T$ level of a storage cell in comparison to a reference cell.
Figure 13B:
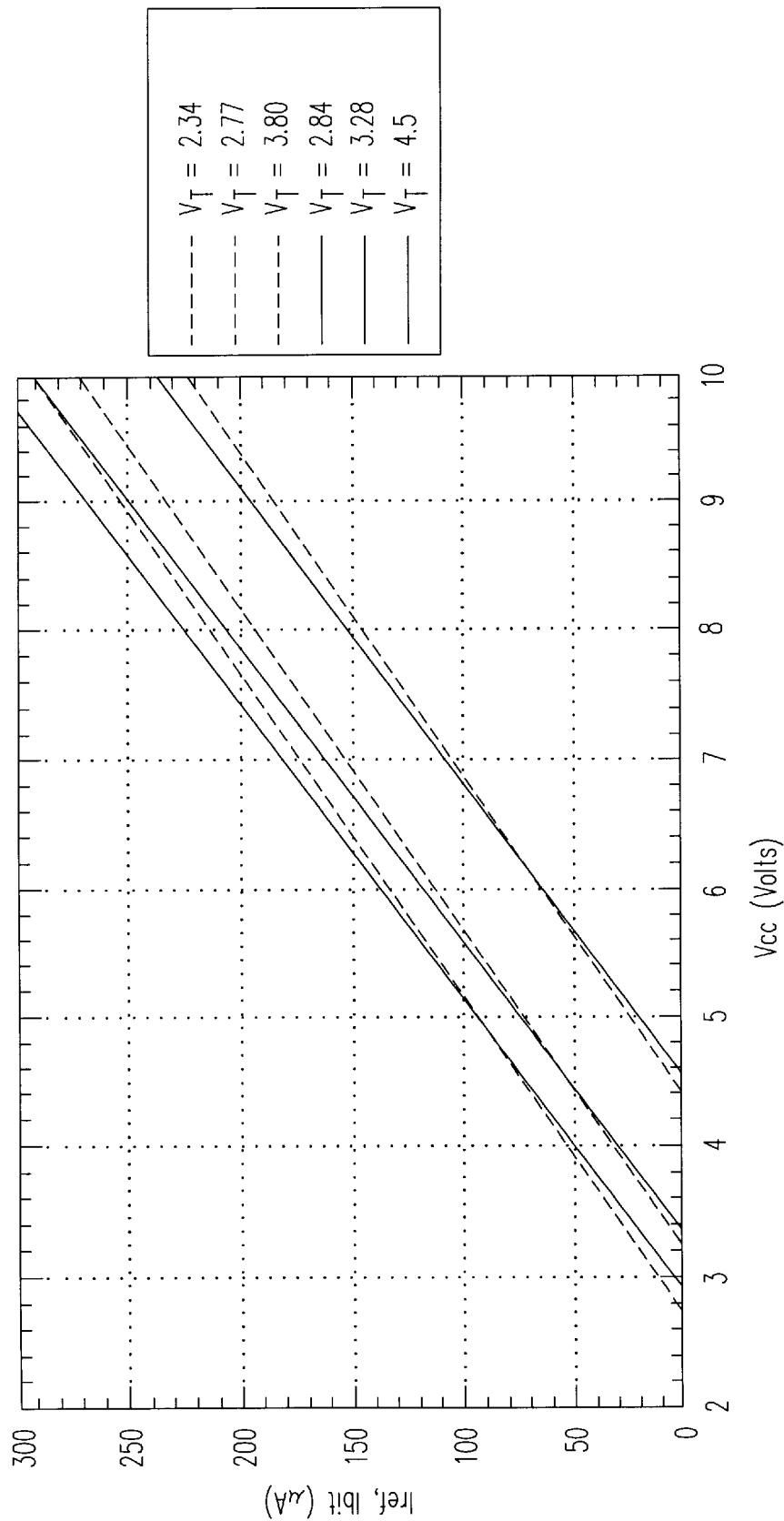

The differential amplifier 1102 is used to compare the threshold voltage $V_T$ of a storage cell in the core storage 210 to the threshold voltage $V_T$ of a reference cell having substantially the same layout as the storage cell in core storage 210. Referring to FIGS. 13A and 13B in conjunction with FIG. 11, sensing of multiple-levels for a single storage cell is performed using a relationship of cell current and voltage. The cell current and voltage are plotted graphically to show a threshold voltage $V_T$ line 1202 for the storage cell and threshold voltage $V_T$ line 1204 for the reference cell where the slope of the line corresponds to the transconductance $g_m$ of the cells.

The slope, and therefore the transconductance $g_m$, is set by the bias voltage applied to a reference cell of the reference cell array 600. If a smaller bias is applied, the slope and transconductance $g_m$ are reduced. Through selection of the bias, selection of a differential sensing mode determines the effective transconductance $g_{mREF}$ of the reference cell. The threshold voltage $V_T$ lines 1302 and 1304 intercept at a point, called a VCC threshold, in which the cell current $I_{BIT}$ of the storage cell is equal to the cell current $I_{REF}$ of the reference cell. The VCC threshold is typically monitored to detect the state of a bit when a differential amplifier is used to read a storage cell. When the cell current $I_{BIT}$ of the storage cell is less than the cell current $I_{REF}$ of the reference cell, the bit is in a first state. When the cell current $I_{BIT}$ of the storage cell reaches and exceeds the cell current $I_{REF}$ of the reference cell, the bit is in a second state. The differential amplifier 1102 receives the cell current $I_{BIT}$ of the storage cell at a first input terminal and receives the cell current $I_{REF}$ of the reference cell at a second input terminal. The differential amplifier 1102 detects small differences between the cell currents $I_{BIT}$ and $I_{REF}$ with high sensitivity and sets an output level of "0" or "1" depending on which cell current signal is larger.

Multiple bits of data are stored in a single storage cell by setting multiple different VCC thresholds in a single reference cell and comparing the threshold voltage $V_{TBIT}$ of the single storage cell to a plurality of cell currents $I_{REF}$ of the reference cell having different threshold voltages $V_{TREF}$. A typical operating voltage range of an integrated circuit is from 4 volts to 10 volts so that a conventional single bit of data is stored using a single VCC threshold of 4.5 volts, for example. The storage of multiple bits in a single storage cell is achieved by setting a plurality of VCC threshold voltages in a single reference cell. For example, four VCC threshold levels for a single cell may be set at 6, 7, 8, and 9 volts in a single reference cell, defining four states so that two bits of data are stored in a cell.

The number of bits stored in a single storage cell is increased much further by combining a plurality of reference cells for connection to the reference presense amplifier 1104. Accordingly, the reference cell block 204 shown in FIG. 2 includes a plurality of reference cells corresponding to a single storage cell in the core storage 210 with each reference cell including a plurality of VCC threshold voltages. For example, a nonvolatile storage for storing 16 levels is implemented using four reference cells with each reference cell designating four VCC threshold voltages. Typically each of the four reference cells includes the same VCC threshold levels but the different reference cells have different voltage offsets so that the VCC threshold levels of the reference cells correspond to different ranges. The usage of multiple reference cells is advantageous for improving the resolution of threshold voltage $V_T$ in a storage cell while sensing within the range of voltages that are normally applied to an integrated circuit.

In an alternative embodiment, the reference cells of the reference cell array 600 may be configured to select only a single VCC threshold voltage with multiple levels being selected for a storage cell by supplying a plurality of reference cells. For example, sixteen levels may be supplied using sixteen reference arrays, each of which designate only a single VCC threshold voltage.

Reference cells of the reference cell block 204 are programmed by applying a series of programming pulses to the memory cells of the reference cell block 204 to adjust the threshold voltage $V_T$ to selected values. The multiple VCC threshold voltages in each reference cell and for all reference cells are precisely programmed and tuned to a suitable value. The reference cells are electrically erasable to facilitate the precise tuning of the VCC threshold voltages. Referring to FIGS. 13A and 13B, changes to the programming of the reference cell shift the position of the $I_{REF}$/VCC lines so that slight changes may result in a substantial change in a VCC threshold intersection point. Also, overadjustment of a single VCC target voltage sometimes causes misalignment of many or all windows of a reference cell or multiple reference cells.

Variations in processing of integrated circuits are sufficient to cause large in errors in VCC threshold level for a multiple-level sensing scheme. Furthermore, due to the digital nature of programming of the reference cells, a desired target VCC threshold may not be achieved in some instances so that mutual reprogramming of the multiple VCC threshold voltages of the multiple reference cells is necessary to program nonoverlapping windows. Therefore, the reference cells are programmable and erasable so that the cells may be tuned to precisely define suitable VCC threshold voltages in a multiple-level sensing storage interface 200.

Figure 14:
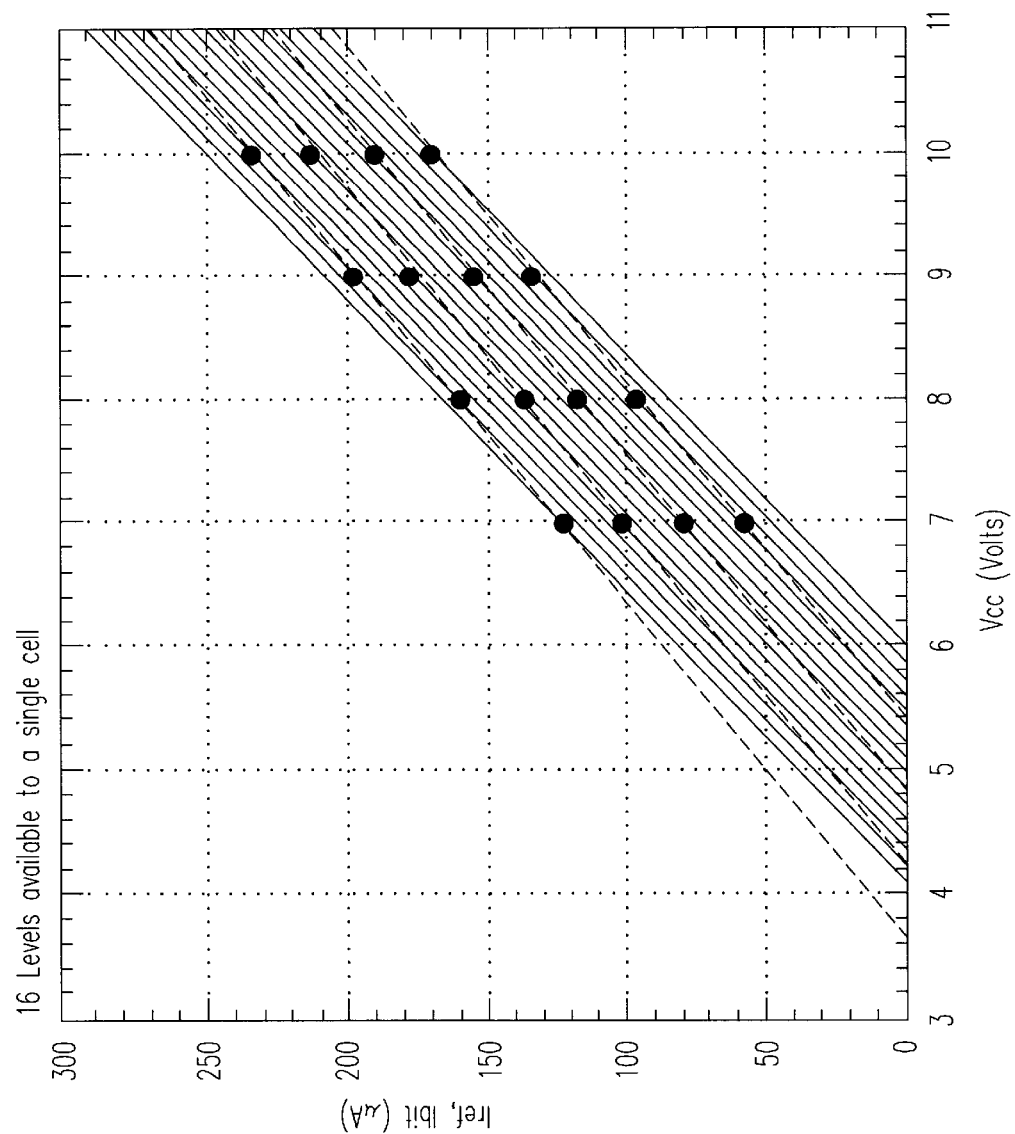
FIG. 14 is a graph showing an example of a correlation between VCC threshold voltages and threshold voltage $V_T$ for defining sixteen levels in a single storage cell.

Referring to FIG. 14, a graph illustrates an exemplary correlation between VCC threshold voltages and threshold voltage $V_T$ for defining sixteen levels in a single storage cell. Typically, the reference cell is programmed and fined-tuned using the electrically-erasable characteristic of the storage interface 200. The VCC thresholds are measured and the reference cells are programmed, erased if necessary, and fine-tuned to stack the reference voltage windows to define multiple states. TABLE I, as follows, tabulates the multiple threshold voltages $V_{TBIT}$ programmed for each of the four reference cells $V_{TS}$.

TABLE I

| Reference Cell 1 Vtr = 3.2 V | Reference Cell 2 Vtr = 3.7 V | Reference Cell 3 Vtr = 4.2 V | Reference Cell 4 Vtr = 4.7 V |
|---|---|---|---|
| 4.11 | | | |
| 4.24 | | | |
| 4.37 | | | |
| 4.50 | | | |
| | 4.61 | | |
| | 4.74 | | |
| | 4.87 | | |
| | 5.00 | | |
| | | 5.11 | |
| | | 5.24 | |
| | | 5.37 | |
| | | 5.50 | |
| | | | 5.61 |
| | | | 5.74 |
| | | | 5.87 |
| | | | 6.00 |

More stringent tolerance issues are raised for an storage interface 200 having higher multiples of VCC threshold voltages. For example, a storage interface 200 supplying 256 levels per storage cell typically includes programming of 8, 16 or 32 VCC threshold voltages in a single reference cell at a resolution of from ⅛ volt to ½ volt. Accordingly, the usage of electrically erasable reference cells is highly advantageous for programming multiple-level storage cells with a large number of levels, for example, 16 or more levels.

The usage of electrically erasable reference cells is also highly advantageous to improve the yield in manufacturing of memories. For example, if the programming of a single VCC threshold voltage is suitable in 90 percent of programmings, then a 16-level programming is suitable in only about twenty percent of the circuits and a 256-level programming is suitable in about three percent of the circuits.

Electrically erasable reference cells advantageously allow the storage interface 200 to be used in combination with a core storage of different types, models and manufacturers. Similarly, usage of electrically erasability of the reference cells permits utilization of different models or types of reference cell storage.

While the invention has been described with reference to various embodiments, it will be understood that these embodiments are illustrative and that the scope of the invention is not limited to them. Many variations, modifications, additions and improvements of the embodiments described are possible. The invention is defined by the appended claims in light of their full scope of equivalents. For example, the illustrative nonvolatile memory interface allocates sixteen or 256 levels for each memory cell of the nonvolatile memory. In other embodiments, fewer or more levels may be allocated for each memory cell, typically ranging from four levels (defining two bits) to a theoretically unlmited number of levels. The upper limit to the number of levels is determined by practical considerations such as circuit size which are unrelated to the limitations of the described invention.

What is claimed is:

1. A circuit comprising:

an interface circuit for interfacing to a nonvolatile memory, the nonvolatile memory including an individual memory cell, the interface circuit including a comparing circuit for comparing a data level of the individual memory cell to a reference data level;

a programmable and electrically erasable reference cell circuit generating the reference data level of a plurality of reference data levels defining a plurality of data states of the individual memory cell;

a first plurality of conductive lines coupling the interface circuit to the reference cell circuit;

a second plurality of conductive lines for coupling the interface circuit to an erase voltage source; and a plurality of switches alternatively blocking the first plurality of conductive lines while coupling the second plurality of conductive lines and coupling the first plurality of conductive lines while blocking the second plurality of conductive lines.

2. A circuit according to claim 1 wherein:

the programmable and electrically erasable reference cell circuit includes an individual reference cell which is programmed to define a plurality of data states in the individual memory cell.

3. A circuit according to claim 1 wherein:

the programmable and electrically erasable reference cell circuit includes a plurality of reference cells which are programmed to define a plurality of data states in the individual memory cell.

4. A circuit according to claim 1 wherein:

the programmable and electrically erasable reference cell circuit includes a plurality of reference cells to define a plurality of data states in the individual memory cell, ones of the plurality of reference cells being programmed to define a plurality of data states in the individual memory cell.

5. A circuit according to claim 1 further comprising:

a differential amplifier having a first differential input terminal coupled to the nonvolatile memory and a second differential input terminal coupled to the reference array circuit, the differential amplifier sensing a data state based on a comparison of a threshold voltage $V_T$ of the individual memory cell to a threshold voltage of the reference cell.

6. A circuit according to claim 1 wherein the nonvolatile memory is selected from among the group of erasable electrically programmable random access memory (EEPROM), electrically programmable random access memory (EPROM), and FLASH memory.

7. A circuit according to claim 1 wherein:

the reference cell circuit includes an array of field effect transistors having source, drain, gate and substrate terminals; and the first plurality of conductive lines and the second plurality of conductive lines are coupled to the source, drain, gate and substrate terminals of the reference cell circuit.

8. A circuit according to claim 1 wherein:

the programmable and electrically erasable reference cell circuit includes a plurality of reference cells defining a plurality of threshold voltage windows corresponding to data states in the individual memory cell, individual reference cells of the plurality of reference cells defining a plurality of threshold voltage windows mutually arranged among the plurality of reference cells to define mutually nonoverlapping threshold voltage windows.

9. A method of operating a nonvolatile memory comprising the steps of:

programming a plurality of threshold voltages in a reference storage, the threshold voltages defining a plurality of data states of an individual memory cell of the nonvolatile memory;

electrically erasing selected ones of the programmed plurality of threshold voltages in the reference storage; and fine-tune programming the selected ones of the programmed plurality of threshold voltages in the reference storage.

10. A method according to claim 9 further comprising the steps of:

sensing a voltage from an individual memory cell of the nonvolatile memory;

sensing a plurality of programmed threshold voltages from the reference storage;

comparing the sensed voltage from the individual memory cell to the sensed plurality of programmed threshold voltages from the reference storage; and determining a multiple-bit data value based on the comparison result.

11. A method according to claim 9 wherein the step of programming a plurality of threshold voltages in a reference storage further comprises the steps of:

programming an individual electrically-erasable reference cell to define a plurality of data states in the individual memory cell of the nonvolatile memory.

12. A method according to claim 9 wherein the step of programming a plurality of threshold voltages in a reference storage further comprises the steps of:

programming a plurality of electrically-erasable reference cells to define a plurality of data states in the individual memory cell of the nonvolatile memory.

13. A method according to claim 9 wherein the step of programming a plurality of threshold voltages in a reference storage further comprises the steps of:

programming a plurality of electrically-erasable reference cells to define a plurality of data states in the individual memory cell of the nonvolatile memory; and programming individual electrically-erasable reference cells of the plurality of electrically-erasable reference cells to define a plurality of data states in the individual memory cell of the nonvolatile memory.

14. A method according to claim 9 further comprising the steps of:

sensing a voltage from an individual memory cell of the nonvolatile memory;

sensing a plurality of programmed threshold voltages from the reference storage;

differentially comparing a threshold voltage $V_T$ of the individual memory cell to the sensed plurality of programmed threshold voltages from the reference cell using a differential amplifier; and determining a multiple-bit data value based on the comparison.

15. An electronic system including a processor, a memory and a system bus comprising:

a memory circuit performing the method according to claim 9.

16. A memory circuit for operating a nonvolatile memory comprising:

a reference storage;

means coupled to the reference storage for programming a plurality of threshold voltages in the reference storage, the threshold voltages defining a plurality of data states of an individual memory cell of the nonvolatile memory;

means coupled to the reference storage for electrically erasing selected ones of the programmed plurality of threshold voltages in the reference storage; and means coupled to the reference storage for fine-tune programming the selected ones of the programmed plurality of threshold voltages in the reference storage.

17. A memory circuit according to claim 16 further comprising:

means for sensing a voltage from an individual memory cell of the nonvolatile memory;

means coupled to the reference storage for sensing a plurality of programmed threshold voltages from the reference storage;

means coupled to the reference storage and coupled to the nonvolatile memory for comparing the sensed voltage from the individual memory cell to the sensed plurality of programmed threshold voltages from the reference storage; and means coupled to the comparing means for determining a multiple-bit data value based on the comparison result.

18. A memory circuit according to claim 16 wherein the means for programming a plurality of threshold voltages in a reference storage further comprises:

means for programming an individual electrically-erasable reference cell to define a plurality of data states in the individual memory cell of the nonvolatile memory.

19. A memory circuit according to claim 16 wherein the means for programming a plurality of threshold voltages in a reference storage further comprises:

means for programming a plurality of electrically-erasable reference cells to define a plurality of data states in the individual memory cell of the nonvolatile memory.

20. A memory circuit according to claim 16 wherein the means for programming a plurality of threshold voltages in a reference storage further comprises:

means for programming a plurality of electrically-erasable reference cells to define a plurality of data states in the individual memory cell of the nonvolatile memory; and means for programming individual electrically-erasable reference cells of the plurality of electrically-erasable reference cells to define a plurality of data states in the individual memory cell of the nonvolatile memory.

21. A memory circuit according to claim 16 further comprising:

means coupled to the nonvolatile memory for sensing a voltage from an individual memory cell of the nonvolatile memory;

means coupled to the reference storage for sensing a plurality of programmed threshold voltages from the reference storage;

a differential amplifier for comparing a threshold voltage $V_T$ of the individual memory cell to the sensed plurality of programmed threshold voltages from the reference cell; and means coupled to the differential amplifier for determining a multiple-bit data value based on the comparison.

22. A memory circuit according to claim 16 wherein:

the nonvolatile memory is selected from among the group of erasable electrically programmable random access memory (EEPROM), electrically programmable random access memory (EPROM), and FLASH memory.

23. A computer system comprising:

a processor;

a nonvolatile memory coupled to the processor;

an interface circuit coupled to the nonvolatile memory, the nonvolatile memory including an individual memory cell;

a programmable and electrically erasable reference cell circuit defining a plurality of data states of the individual memory cell;

a first plurality of conductive lines coupling the interface circuit to the reference cell circuit;

a second plurality of conductive lines for coupling the interface circuit to an erase voltage source; and a plurality of switches alternatively blocking the first plurality of conductive lines while coupling the second plurality of conductive lines and coupling the first plurality of conductive lines while blocking the second plurality of conductive lines.

24. A circuit according to claim 1 wherein:

the interface circuit further includes:

an address decoder for decoding memory addresses in the nonvolatile memory; and a level sensor for sensing the data level of the individual memory cell.

25. A circuit according to claim 1 wherein:

the interface circuit further includes:

a plurality of differential amplifiers for sensing and comparing data levels of a plurality of individual memory cells to reference data levels of a plurality of reference data levels.

26. A circuit according to claim 1 wherein:

the interface circuit further includes:

a plurality of differential amplifiers for sensing and comparing data levels of a plurality of individual memory cells to reference data levels of a plurality of reference data levels, an individual differential amplifier of the plurality of differential amplifiers for distinguishing one bit of the data level using a binary search so that an N-bit interface circuit distinguishes $2^N$ data levels.

* * * * *

UNITED STATES PATENT AND TRADEMARK OFFICE
CERTIFICATE OF CORRECTION

PATENT NO.   : 5,774,395
ISSUE DATE   : June 30, 1998
INVENTOR(S)  : Richart, Robert B.; Garg, Shyam It is certified that error appears in the above-identified patent and that said Letters Patent is hereby corrected as shown below:

On the title page;
*Attorney, Agent or Firm:* Change "SKJERVEN, MORILL..." to --SKJERVEN, MORRILL...--

*Reference/Publication:* Change "Bauer...IEE..." to --Bauer...IEEE...--

Col. 3, line 57; Delete "FIGURE 6" and insert --FIGURES 6a - 6c--

Col. 5, line 11; Delete "(Vt)" and insert --$V_T$--

Col. 11, line 5; change each occurrence of "Vtr" to --$V_T$--

Signed and Sealed this

Sixth Day of April, 1999

Attest:

Q. TODD DICKINSON

*Attesting Officer*   *Acting Commissioner of Patents and Trademarks*